US012000040B1

(12) United States Patent
Walach et al.

(10) Patent No.: US 12,000,040 B1
(45) Date of Patent: Jun. 4, 2024

(54) CLEANING ANTI-REFLECTIVE COATING PROCESS CHAMBER PARTS

(71) Applicants: Michael Walach, Largo, FL (US); Gregory Boruta, Largo, FL (US)

(72) Inventors: Michael Walach, Largo, FL (US); Gregory Boruta, Largo, FL (US)

(*) Notice: Subject to any disclaimer, the term of this patent is extended or adjusted under 35 U.S.C. 154(b) by 0 days.

(21) Appl. No.: 18/542,612

(22) Filed: Dec. 16, 2023

Related U.S. Application Data

(62) Division of application No. 18/486,746, filed on Oct. 13, 2023.

(51) Int. Cl.
B08B 13/00 (2006.01)
A47L 7/00 (2006.01)
B08B 5/04 (2006.01)
B08B 7/02 (2006.01)
B08B 15/02 (2006.01)
C23C 16/44 (2006.01)

(52) U.S. Cl.
CPC ........ *C23C 16/4401* (2013.01); *A47L 7/0071* (2013.01); *B08B 5/04* (2013.01); *B08B 7/02* (2013.01); *B08B 13/00* (2013.01); *B08B 15/023* (2013.01)

(58) Field of Classification Search
CPC ..... C23C 16/4401; A47L 7/0071; B08B 5/04; B08B 7/02; B08B 13/00; B08B 15/023; H01J 37/32862
See application file for complete search history.

(56) References Cited

U.S. PATENT DOCUMENTS

| | | | | | |
|---|---|---|---|---|---|
| 5,531,857 | A | * | 7/1996 | Engelsberg | B23K 26/1436 134/1 |
| 5,569,074 | A | * | 10/1996 | Gressel | B08B 15/023 108/142 |
| 2002/0132190 | A1 | * | 9/2002 | Brewer | G03F 7/091 430/311 |
| 2008/0092806 | A1 | * | 4/2008 | West | C23C 16/4407 134/1 |

FOREIGN PATENT DOCUMENTS

CN 215391327 U * 1/2022

OTHER PUBLICATIONS

Machine translation of CN-215391327-U (Year: 2022).*

* cited by examiner

Primary Examiner — Erin F Bergner
(74) Attorney, Agent, or Firm — SANDOLLAR; Alan Harrison

(57) ABSTRACT

A cleaning booth has a handheld blaster, which emits a pulsed electromagnetic wave that is produced by a wave source. A fiber-optic cable feeds the wave from the source to the blaster. An operator can aim the blaster toward a part that rests on a movable table in the booth. When the operator actuates the wave source, a radiation beam from the blaster ablates anti-reflective coating residue from the part. The cleaning operation can be performed in a same room as the anti-reflective coating process equipment.

7 Claims, 4 Drawing Sheets

CLEANING ANTI-REFLECTIVE COATING PROCESS CHAMBER PARTS

BACKGROUND

The technology relates to ophthalmic lens manufacturing processes, particularly the cleaning of parts that are used in vapor deposition chambers for anti-reflective (AR) coatings on polymer ophthalmic lenses.

AR coating deposition requires high vacuum. After degassing lenses for about 1 hour, they are heated to 200 F to remove moisture. Plasma vapor deposition of MgO is then absorbed into pores of high-index lenses. Typically, an AR coating includes hydrophobic and/or oleophobic compounds. An AR coating room must be A2 or A3 cleanliness, low humidity.

During deposition of an AR coating, the coating not only goes onto the lenses held in the chamber but also deposits onto the stainless steel parts that hold the lenses and other deposition chamber components. Because stainless steel is a somewhat porous material and the deposition process occurs at a relatively high temperature that opens those pores, the AR coating also is absorbed into the pores of the stainless steel parts. Build up of AR coating residue on the chamber parts and in the pores of the chamber parts gradually causes problems with coating thickness tolerance, as during subsequent deposition processes the built-up residue provides a source of coating material in addition to the intentional source. Accordingly, the internal parts of AR lens coating chambers periodically need to be cleaned.

SUMMARY

Typically, AR lens coating labs use silicon dioxide bead blasting to abrade AR coating residue from the vapor deposition chamber parts. Such bead blasting is done slowly at room temperature and is a very dusty process. Typically, bead blasting is done to the internal parts every 3-6 deposition cycles. Bead blasting is dirty and time consuming. The dust can contaminate surrounding equipment, so that the bead blasting is typically done in a room that is separated from other areas of the optical lab. The dust poses health risks to lab workers and accordingly, protective equipment must be provided and maintained by the lab operator. Transporting the parts to and from a separate room, with appropriate dust control protocols, set up and removal time, adds time and expense to the overall AR coating process. Additionally, the bead blasting is not effective to remove the AR coating residue from pores of the stainless steel parts. Accordingly, lab operators typically run the AR deposition chamber on an "empty cycle" after reinstalling the bead blasted parts, in order to evacuate the residue from pores of the parts. The empty cycle further increases the time and expense of the overall AR coating process.

So far, the ophthalmic industry has accepted expenses and product losses associated with bead blasting as a cleaning method for AR chamber parts.

The present technology provides, among other things, a solution for reducing the time, expense, and product contamination that are associated with the currently accepted method of cleaning AR coating deposition chamber parts. The technology enables cleaning the parts without dust and with less labor than previously achievable. This enables the cleaning operation to be performed under the same roof as the coating operation, and without tedious donning and doffing of dust-protective clothing. The cleaning operation even can be performed in the same room as the AR coating process chamber, which significantly reduces labor time just in transporting chamber parts to and from the cleaning booth. Additionally, the cleaning operation itself takes about 20% of the time required for bead blasting, and may be effective to remove coating residue that is trapped in the pores of the stainless steel chamber parts, without requiring an "empty cycle" of the deposition chamber.

The technology may include a cleaning booth apparatus for removing anti-reflective coating residue from vapor deposition chamber parts. The cleaning booth may include an enclosure; an electromagnetic wave source; a trigger operable to actuate the electromagnetic wave source; a blaster connected to the electromagnetic wave source by a fiber-optic cable for feeding electromagnetic radiation from the electromagnetic wave source through the blaster; a table movably mounted within the enclosure; one or more motors operable for moving the table; and one or more control panels configured to control the electromagnetic wave source and/or the motor.

The trigger may be integrated into the blaster.

The one or more control panels may be operable to actuate the one or more motors to move the table into and out of the enclosure. The one or more control panels may be operable to actuate the one or more motors to rotate the table inside the enclosure. The one or more control panels may be operable to adjust one or more of beam width, intensity, or pulse length of the electromagnetic wave source. For example, the one or more control panels may include one or more dials, one or more buttons, and/or one or more sliders that may be operable to vary one or more electrical parameters (e.g., voltage, current, resistance, capacitance, and/or inductance) of one or more components of the electromagnetic wave source. The one or more control panels also may include a display, e.g., an LED screen that may be configured to indicate one or more of an operating condition, electrical parameters, and/or error status of the electromagnetic wave source.

The cleaning booth may also include a protective fabric that lines at least a portion of the enclosure. The protective fabric may be non-reflective and/or fire retardant. For example, the protective fabric may be welding cloth.

The cleaning booth also may include a movable eye-protective shutter at the front of the enclosure, which may be opened for loading parts into the enclosure. The cleaning booth also may include an interlock that prevents actuating the electromagnetic wave source while the shutter is opened.

The cleaning booth also may include a vacuum for removing ash from the enclosure. The cleaning booth also may include an exhaust system for removing smoke from the enclosure.

The technology may provide a method for removing anti-reflective coating residue from vapor deposition chamber parts. The method may include placing the parts inside an enclosure that is equipped with an electromagnetic wave source and a blaster, which may be configured for handheld direction of electromagnetic radiation from the electromagnetic wave source into the enclosure. The method also may include bathing the parts in radiation from the electromagnetic wave source by handling the blaster.

The method also may include, after placing the parts inside the enclosure, closing a protective shutter of the enclosure.

The method also may include, before actuating the electromagnetic wave source, activating an exhaust system to remove smoke from the enclosure.

The method also may include placing the parts on a movable table and actuating a motor to move the table into the enclosure.

Bathing the parts in radiation also may include actuating a motor to rotate the table within the enclosure, and/or adjusting one or more of beam width, intensity, or pulse length of the electromagnetic wave source.

The method also may include, after bathing the parts in radiation, actuating a vacuum to remove ash from the enclosure.

DRAWINGS

DETAILED DESCRIPTION

Overview

As mentioned, the technology resolves issues of time and dust contamination that are associated with the currently accepted method for cleaning AR coating vapor deposition chamber parts. This may be accomplished by bathing vapor deposition chamber parts in a beam of electromagnetic radiation within a controlled environment, such as a cleaning booth apparatus 100 (shown in FIG. 1 and FIG. 2).

The beam ablates the AR coating residue on the parts and also may heat the parts to about 250° F.-400° F. By heating the contaminated parts, the technology may advantageously open the pores of the stainless steel so that AR coating residue that has been absorbed into the pores can be released and removed in a way that is not accomplished by room-temperature bead blasting.

The electromagnetic radiation is preferably at 1028 nanometer or at 1080 nanometer wavelength. Preferably, the radiation is focused to a spot size between 2 and 15 centimeters at the table surface; in some embodiments, between 3 and 6 centimeters spot size; in some embodiments, about 4 centimeters spot size.

Example System(s)

Figure 1:
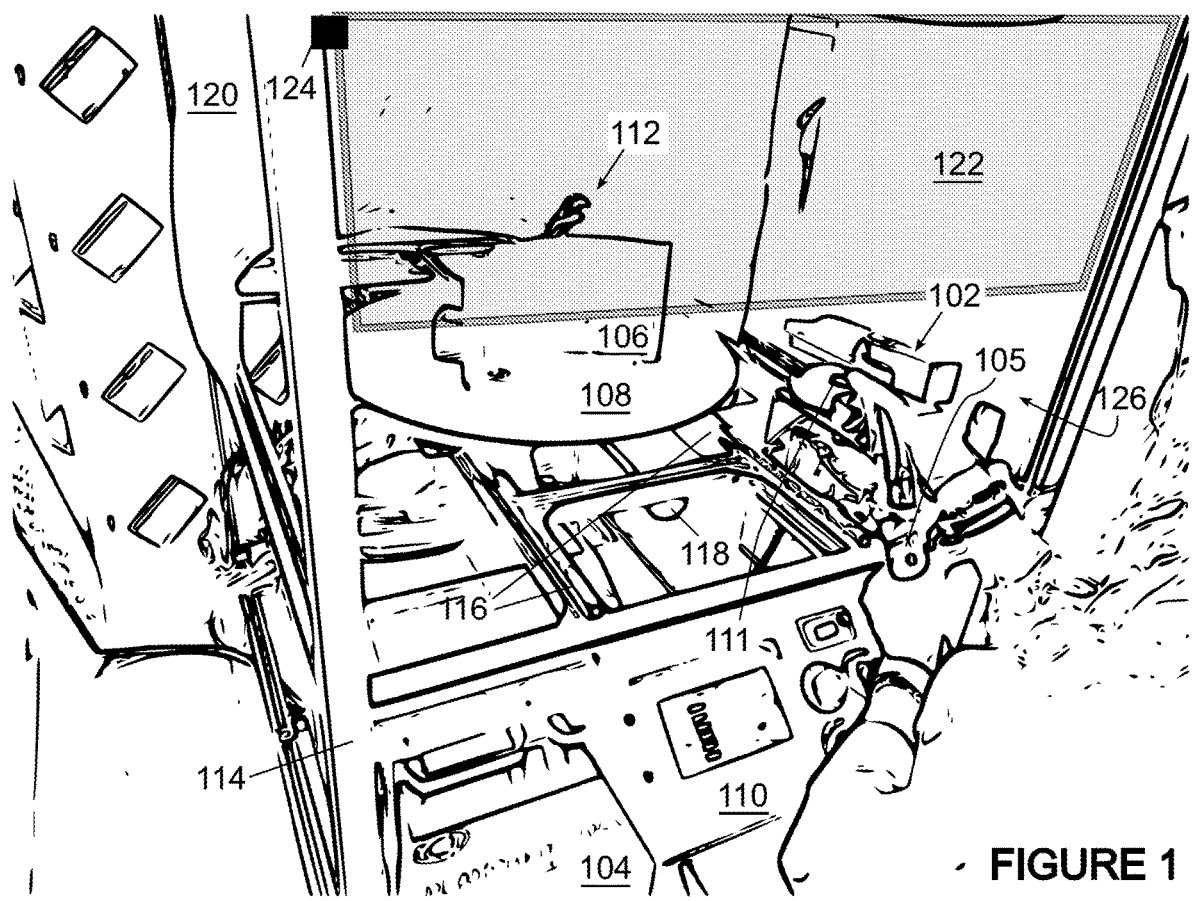
FIG. 1 depicts a cleaning booth apparatus, according to embodiments of the technology.

As shown in FIG. 1, a cleaning booth apparatus 100 may comprise a handheld radiation gun or blaster 102, which may emit a pulsed electromagnetic wave that may be produced by a generator or wave source 104. A fiber-optic cable 105 may feed the wave from the generator 104 to the blaster 102. The wave source 104 and other components of the cleaning booth 100 may be controlled by a panel 110 that is installed at the front of the apparatus.

An operator of the cleaning booth 100 may aim the blaster 102 toward a part 106 that rests on a movable table 108. In operation of the apparatus, the part 106 may be contaminated with anti-reflective coating residue. When the operator actuates the wave source 104 by pressing a trigger 111 of the blaster, a radiation beam from the blaster 102 may ablate the residue from the part.

The table 108 may be provided with a stand 112 for mounting small parts. Larger parts, such as the part 106, may rest on the table. The table may move laterally in and out of the system enclosure 114 on rails 116. When the table is fully loaded into the enclosure, parts at the front side of the table may be within the focal length of the blaster 102. The table also may rotate within the enclosure. Stepper motors 118 may drive the table. At least a portion of the enclosure (e.g., the inner walls near the table 106) may be lined with heat-resistant, non-reflective protective fabric 120 (e.g., welding cloth or similar fire-retardant fabric) to absorb radiation that reflects from or misses the parts to be cleaned.

The cleaning booth 100 also may include an eye-protective shutter 122 that can be opened to permit the table to move out of the enclosure, e.g., for loading parts. The apparatus also may have a safety interlock 124 that prevents the wave source 104 being energized while the shutter is opened. There may be an opening 126 at the bottom of the shutter to permit an operator to insert her arm into the chamber and direct the blaster at the parts.

Figure 2:
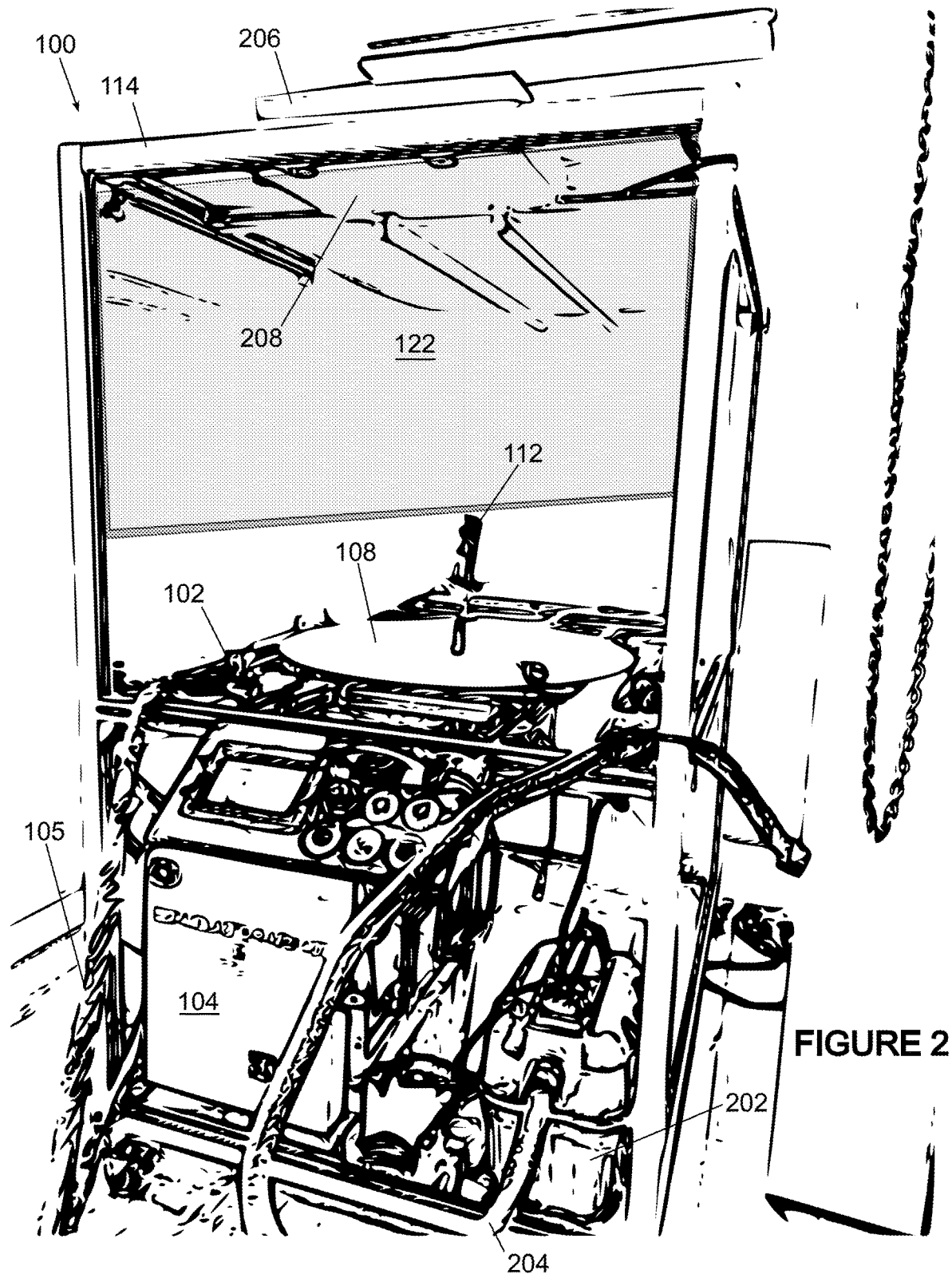
FIG. 2 depicts the cleaning booth apparatus that is shown in FIG. 1.

Referring to FIG. 2, the cleaning booth 100 also may include a vacuum 202 with a hose 204 for removing ablation ash from the table. The cleaning booth 100 also may be provided with an exhaust fan 206 and a filtration assembly 208 at the top of the enclosure. The filtration assembly may include a HEPA filter and a carbon filter, in a flow path between the interior of the enclosure and the exhaust fan, for extracting ablation vapor from the exhaust flow.

Figure 3:
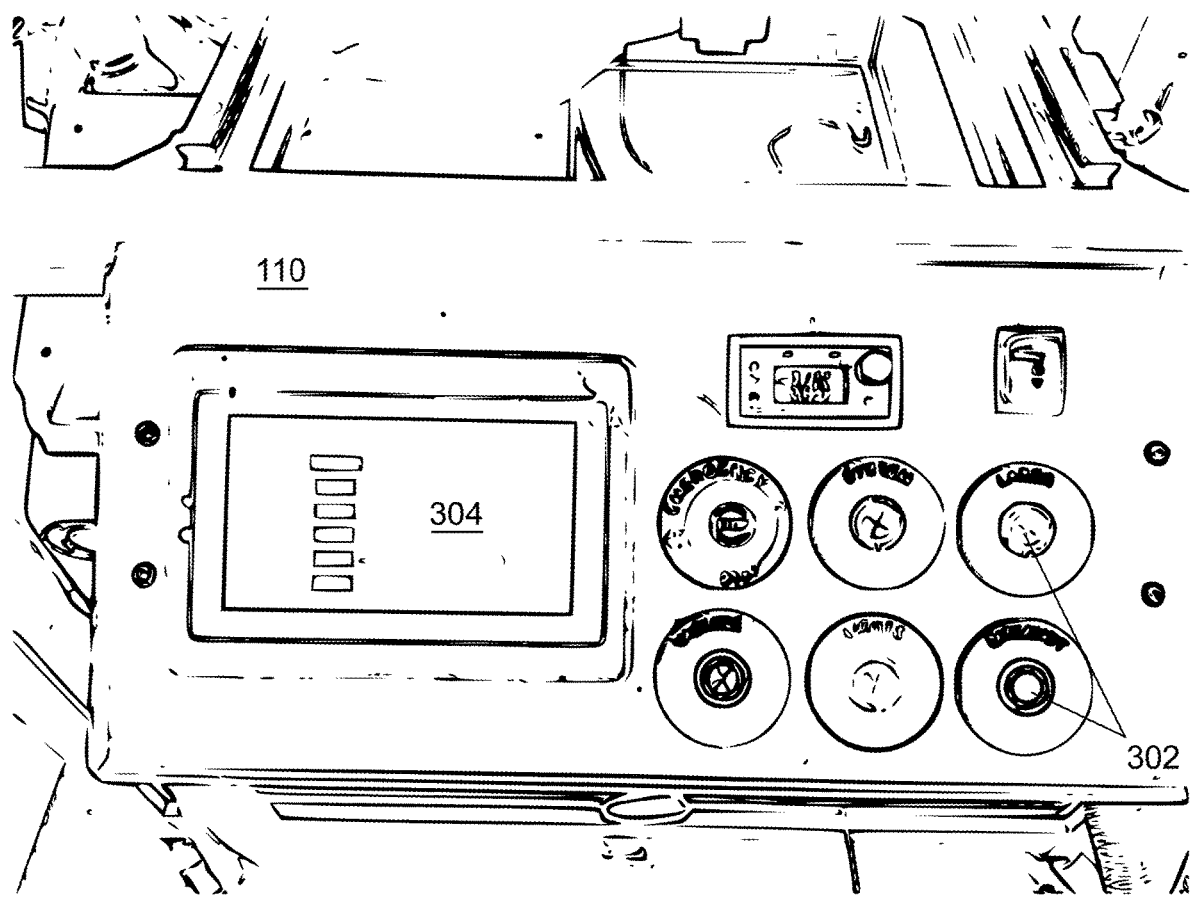
FIG. 3 depicts details of a control panel of the cleaning booth apparatus.

FIG. 3 depicts details of the control panel 110. For example, the control panel may include one or more buttons 302, and/or a touch screen 304, which may be operable to energize or de-energize one or more components of the cleaning apparatus. For example, certain buttons may energize or de-energize the vacuum, the motors that rotate or translate the table, the exhaust system, the wave source, or lights that illuminate the enclosure. The touch screen 304 also may be configured to indicate and/or modify one or more of an operating condition, electrical parameters, and/or error status of the electromagnetic wave source. The control panel may be implemented as one or more control panels.

Example Method(s)

A method according to the technology comprises exposing parts, which are contaminated with anti-reflective coating residue, to pulsed electromagnetic radiation at about 1080 nanometer or 1028 nanometer wavelength, a beam width of between 2 and 15 centimeters (in some embodiments, between 3 and 6 centimeters; in some embodiments, about 4 centimeters), and an intensity of between about 65 $W/cm^2$ and about 250 $W/cm^2$. In some embodiments, the electromagnetic radiation may be scanned across the parts, either by moving the parts or moving the radiation source or both. In some embodiments, each contaminated surface of each part may be exposed to the radiation for sufficient time to heat the contaminated surface to at least 250° F. and in some embodiments at least 300° F. but no more than 450° F. Advantageously, heating the contaminated surface may cause pores of the contaminated surface to expand so that residue can be extracted from the pores. Advantageously, radiation cleaning may take about 20% of time in the chamber compared to bead blasting. Additionally, radiation cleaning may not require the amount of set up, protective apparel, isolation, and clean up compared to bead blasting.

It is of significance to note that, in some embodiments, the proposed electromagnetic bathing apparatus may not contaminate clean room air and may fully comply with FED 209 E 100K or ISO 8 clean room standards. Thus, the proposed apparatus may advantageously eliminate rejects due to scratches of lenses caused by accidental bead particles contamination, and may significantly improve the ergonomics and costs of the cleaning process.

Figure 4:
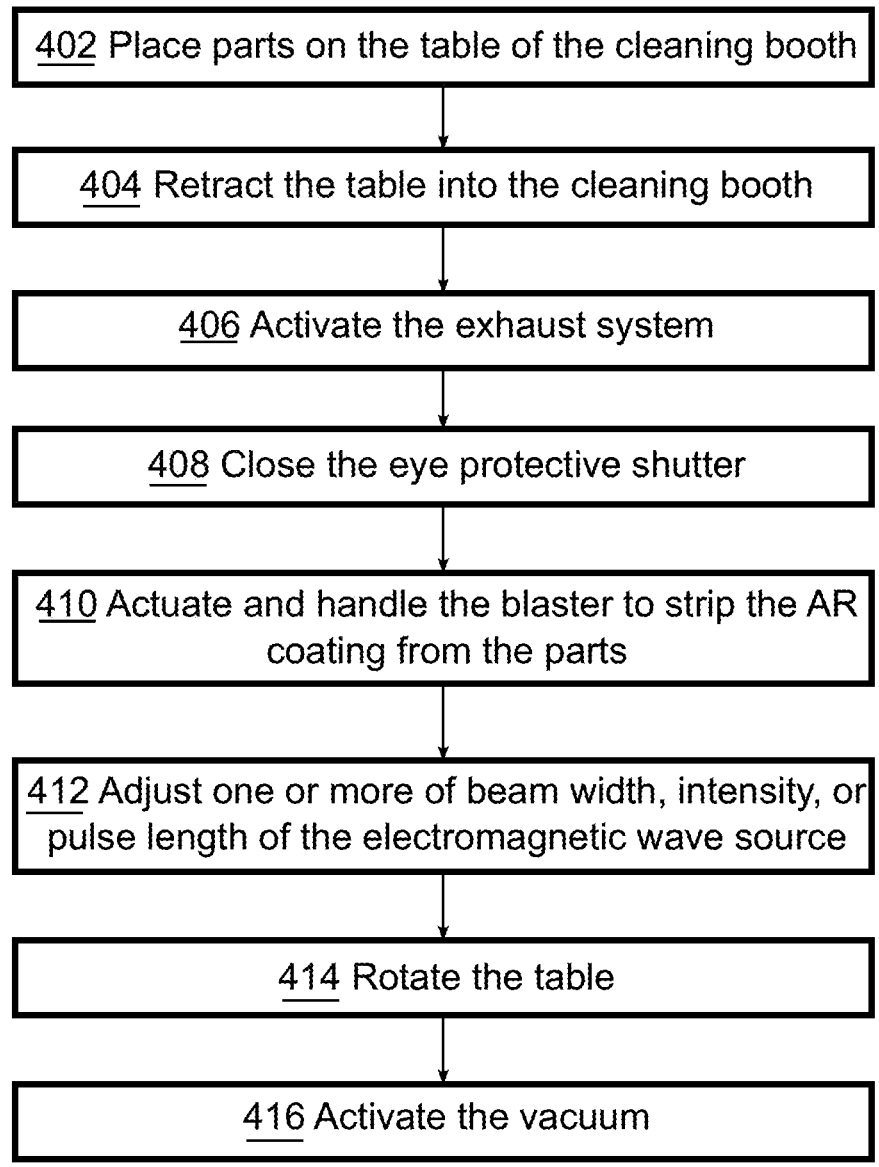
FIG. 4 is a flow chart that depicts steps of a cleaning method, according to embodiments of the technology.

FIG. 4 depicts steps of a method 400, according to embodiments of the technology. At 402, place parts on the table of the cleaning booth. At 404, retract the table into the cleaning booth (if it was not already inside the booth). At 406, optionally, activate the exhaust system of the cleaning booth. At 408, optionally, close the eye protective shutter of the cleaning booth. At 410, actuate and handle the blaster of the cleaning booth to strip the AR coating from the parts. Optionally, at 412, adjust one or more of beam width, intensity, or pulse length of the electromagnetic wave source. Optionally, at 414, rotate the table (e.g., by actuating a motor). At 416, optionally, actuate the vacuum of the cleaning booth to remove ash from the stripped coating.

The invention claimed is:

1. A method for coating ophthalmic lenses with anti-reflective coating, the method comprising:
    placing the lenses into an anti-reflective coating process chamber;
    operating the process chamber;
    removing process chamber parts from the process chamber;
    placing the process chamber parts inside an enclosure, in the same room as the process chamber, that is equipped with an electromagnetic wave source and a blaster, wherein the blaster is configured for handheld direction of electromagnetic radiation from the electromagnetic wave source into the enclosure; and
    bathing the process chamber parts in radiation from the electromagnetic wave source by actuating the electromagnetic wave source and handling the blaster.

2. The method of claim 1, further comprising, before actuating the electromagnetic wave source, activating an exhaust system to remove smoke from the enclosure.

3. The method of claim 1, wherein placing the parts inside the enclosure comprises placing the parts on a movable table and actuating a motor to move the table into the enclosure.

4. The method of claim 1, wherein bathing the parts in radiation further comprises actuating a motor to rotate the table within the enclosure.

5. The method of claim 1, wherein bathing the parts in radiation further comprises adjusting one or more of beam width, intensity, or pulse length of the electromagnetic wave source.

6. The method of claim 1, further comprising, after bathing the parts in radiation, actuating a vacuum to remove ash from the enclosure.

7. The method of claim 1, wherein actuating the electromagnetic wave source comprises pressing a trigger of the blaster.

* * * * *